United States Patent
Pullela et al.

(10) Patent No.: US 9,444,485 B2
(45) Date of Patent: *Sep. 13, 2016

(54) SUCCESSIVE APPROXIMATION ANALOG-TO-DIGITAL CONVERTER (ADC) WITH DYNAMIC SEARCH ALGORITHM

(71) Applicant: MaxLinear, Inc., Carlsbad, CA (US)

(72) Inventors: Raja Pullela, Irvine, CA (US); Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/811,139

(22) Filed: Jul. 28, 2015

(65) Prior Publication Data

US 2015/0365100 A1 Dec. 17, 2015

Related U.S. Application Data

(63) Continuation of application No. 14/558,004, filed on Dec. 2, 2014, now Pat. No. 9,124,294, which is a continuation of application No. 14/248,851, filed on Apr. 9, 2014, now Pat. No. 8,928,506.

(60) Provisional application No. 61/809,926, filed on Apr. 9, 2013.

(51) Int. Cl.
*H03M 1/00* (2006.01)
*H03M 1/46* (2006.01)
(Continued)

(52) U.S. Cl.
CPC .............. *H03M 1/462* (2013.01); *H03M 1/002* (2013.01); *H03M 1/04* (2013.01); *H03M 1/44* (2013.01); *H03M 1/46* (2013.01)

(58) Field of Classification Search
CPC .......... H03M 1/04; H03M 1/44; H03M 1/46; H03M 1/164; H03M 1/201; H03M 1/182; H03M 1/183; H03M 1/361; H03M 1/0809
USPC ................................................ 341/110–155
See application file for complete search history.

(56) References Cited

U.S. PATENT DOCUMENTS

| | | | |
|---|---|---|---|
| 6,239,734 B1 | 5/2001 | Bae et al. | |
| 6,850,180 B2 | 2/2005 | Hales | |
| 6,980,140 B1 * | 12/2005 | Rowland | H03M 1/0809 341/118 |

(Continued)

OTHER PUBLICATIONS

"Analog-to-Digital Converter", Wikipedia, the free encyclopedia, 14 pages, dated Mar. 12, 2014.

(Continued)

*Primary Examiner* — Lam T Mai
(74) *Attorney, Agent, or Firm* — McAndrews, Held & Malloy, Ltd.

(57) ABSTRACT

Aspects of a method and system for a successive approximation analog-to-digital converter with dynamic search algorithms are provided. In some embodiments, a successive approximation analog-to-digital converter includes a digital-to-analog converter, a comparator, and a search and decode logic modules which cooperate to generate a digital output code representative of the analog input voltage based on a dynamic search algorithm. The dynamic search algorithms may alter a sequence of reference voltages used to successively approximate the analog input voltage based on one or more characteristics of the analog input voltage.

20 Claims, 18 Drawing Sheets

(51) Int. Cl.
   *H03M 1/04*   (2006.01)
   *H03M 1/44*   (2006.01)

(56) References Cited

U.S. PATENT DOCUMENTS

| | | | | |
|---|---|---|---|---|
| 7,224,305 | B2* | 5/2007 | Haartsen | H03M 1/04 |
| | | | | 341/131 |
| 7,332,916 | B2* | 2/2008 | Nagata | G01R 31/2884 |
| | | | | 324/713 |
| 7,609,100 | B2* | 10/2009 | Nagata | G01R 31/2884 |
| | | | | 327/108 |
| 8,362,934 | B2* | 1/2013 | Matsuzawa | H03K 5/2481 |
| | | | | 341/118 |
| 8,384,578 | B2* | 2/2013 | Verbruggen | H03M 1/04 |
| | | | | 341/109 |
| 8,633,846 | B2 | 1/2014 | Wu et al. | |
| 8,922,415 | B2 | 12/2014 | Fogleman et al. | |
| 8,928,504 | B2 | 1/2015 | Su | |
| 8,928,506 | B2* | 1/2015 | Pullela | H03M 1/002 |
| | | | | 341/110 |
| 9,124,294 | B2* | 9/2015 | Pullela | H03M 1/002 |

OTHER PUBLICATIONS

"Digital-to-Analog Converter", Wikipedia, the free encyclopedia, 7 pages, dated Mar. 12, 2014.
U.S. Appl. No. 14/246,576, filed Apr. 7, 2014, Curtis Ling, 34 pages.
U.S. Appl. No. 14/261,870, filed Apr. 25, 2014, Kaveh Moazzami, Pawan Tiwari and Guarav Chandra, 32 pages.

* cited by examiner

FIG. 4A

| | | \multicolumn{7}{c}{7 bits, Vin=15.01} |
|---|---|---|---|---|---|---|---|---|
| | | Step1 | Step2 | Step3 | Step4 | Step5 | Step6 | Step7 |
| 63 | 0111111 | | < | < | < | < | < | < |
| 62 | 0111110 | | < | < | < | < | < | < |
| 61 | 0111101 | | < | < | < | < | < | < |
| 60 | 0111100 | | < | < | < | < | < | < |
| 59 | 0111011 | | < | < | < | < | < | < |
| 58 | 0111010 | | < | < | < | < | < | < |
| 57 | 0111001 | | < | < | < | < | < | < |
| 56 | 0111000 | | < | < | < | < | < | < |
| 55 | 0110111 | | < | < | < | < | < | < |
| 54 | 0110110 | | < | < | < | < | < | < |
| 53 | 0110101 | | < | < | < | < | < | < |
| 52 | 0110100 | | < | < | < | < | < | < |
| 51 | 0110011 | | < | < | < | < | < | < |
| 50 | 0110010 | | < | < | < | < | < | < |
| 49 | 0110001 | | < | < | < | < | < | < |
| 48 | 0110000 | | < | < | < | < | < | < |
| 47 | 0101111 | | < | < | < | < | < | < |
| 46 | 0101110 | | < | < | < | < | < | < |
| 45 | 0101101 | | < | < | < | < | < | < |
| 44 | 0101100 | | < | < | < | < | < | < |
| 43 | 0101011 | | < | < | < | < | < | < |
| 42 | 0101010 | | < | < | < | < | < | < |
| 41 | 0101001 | | < | < | < | < | < | < |
| 40 | 0101000 | | < | < | < | < | < | < |
| 39 | 0100111 | | < | < | < | < | < | < |
| 38 | 0100110 | | < | < | < | < | < | < |
| 37 | 0100101 | | < | < | < | < | < | < |
| 36 | 0100100 | | < | < | < | < | < | < |
| 35 | 0100011 | | < | < | < | < | < | < |
| 34 | 0100010 | | < | < | < | < | < | < |
| 33 | 0100001 | | < | < | < | < | < | < |
| 32 | 0100000 | | < | < | < | < | < | < |
| 31 | 0011111 | | | < | < | < | < | < |
| 30 | 0011110 | | | < | < | < | < | < |
| 29 | 0011101 | | | < | < | < | < | < |
| 28 | 0011100 | | | < | < | < | < | < |
| 27 | 0011011 | | | < | < | < | < | < |
| 26 | 0011010 | | | < | < | < | < | < |
| 25 | 0011001 | | | < | < | < | < | < |
| 24 | 0011000 | | | < | < | < | < | < |
| 23 | 0010111 | | | < | < | < | < | < |
| 22 | 0010110 | | | < | < | < | < | < |
| 21 | 0010101 | | | < | < | < | < | < |
| 20 | 0010100 | | | < | < | < | < | < |
| 19 | 0010011 | | | < | < | < | < | < |
| 18 | 0010010 | | | < | < | < | < | < |
| 17 | 0010001 | | | < | < | < | < | < |
| 16 | 0010000 | | | | < | < | < | < |
| 15 | 0001111 | | | | | | | < |
| 14 | 0001110 | | | | | | < | > |
| 13 | 0001101 | | | | | > | > | > |
| 12 | 0001100 | | | | | < | > | > |
| 11 | 0001011 | | | | | > | > | > |
| 10 | 0001010 | | | | | > | > | > |
| 9 | 0001001 | | | | | > | > | > |
| 8 | 0001000 | | | | < | > | > | > |
| 7 | 0000111 | | | | > | > | > | > |
| 6 | 0000110 | | | | > | > | > | > |
| 5 | 0000101 | | | | > | > | > | > |
| 4 | 0000100 | | | | > | > | > | > |
| 3 | 0000011 | | | | > | > | > | > |
| 2 | 0000010 | | | | > | > | > | > |
| 1 | 0000001 | | | | > | > | > | > |
| 0 | 0000000 | | > | > | > | > | > | > |

| | | Step1 | Step2 | Step3 | Step4 | Step5 | Step6 | Step7 |
|---|---|---|---|---|---|---|---|---|
| | | | | 7 bits, Vin=31.01 | | | | |
| 63 | 0111111 | | < | < | < | < | < | < |
| 62 | 0111110 | | < | < | < | < | < | < |
| 61 | 0111101 | | < | < | < | < | < | < |
| 60 | 0111100 | | < | < | < | < | < | < |
| 59 | 0111011 | | < | < | < | < | < | < |
| 58 | 0111010 | | < | < | < | < | < | < |
| 57 | 0111001 | | < | < | < | < | < | < |
| 56 | 0111000 | | < | < | < | < | < | < |
| 55 | 0110111 | | < | < | < | < | < | < |
| 54 | 0110110 | | < | < | < | < | < | < |
| 53 | 0110101 | | < | < | < | < | < | < |
| 52 | 0110100 | | < | < | < | < | < | < |
| 51 | 0110011 | | < | < | < | < | < | < |
| 50 | 0110010 | | < | < | < | < | < | < |
| 49 | 0110001 | | < | < | < | < | < | < |
| 48 | 0110000 | | < | < | < | < | < | < |
| 47 | 0101111 | | < | < | < | < | < | < |
| 46 | 0101110 | | < | < | < | < | < | < |
| 45 | 0101101 | | < | < | < | < | < | < |
| 44 | 0101100 | | < | < | < | < | < | < |
| 43 | 0101011 | | < | < | < | < | < | < |
| 42 | 0101010 | | < | < | < | < | < | < |
| 41 | 0101001 | | < | < | < | < | < | < |
| 40 | 0101000 | | < | < | < | < | < | < |
| 39 | 0100111 | | < | < | < | < | < | < |
| 38 | 0100110 | | < | < | < | < | < | < |
| 37 | 0100101 | | < | < | < | < | < | < |
| 36 | 0100100 | | < | < | < | < | < | < |
| 35 | 0100011 | | < | < | < | < | < | < |
| 34 | 0100010 | | < | < | < | < | < | < |
| 33 | 0100001 | | < | < | < | < | < | < |
| 32 | 0100000 | | ▓ | < | < | < | < | < |
| 31 | 0011111 | | | | | | | ▓ |
| 30 | 0011110 | | | | | | ▓ | > |
| 29 | 0011101 | | | | | | > | > |
| 28 | 0011100 | | | | | ▓ | > | > |
| 27 | 0011011 | | | | | > | > | > |
| 26 | 0011010 | | | | | > | > | > |
| 25 | 0011001 | | | | | > | > | > |
| 24 | 0011000 | | | | ▓ | > | > | > |
| 23 | 0010111 | | | | > | > | > | > |
| 22 | 0010110 | | | | > | > | > | > |
| 21 | 0010101 | | | | > | > | > | > |
| 20 | 0010100 | | | | > | > | > | > |
| 19 | 0010011 | | | | > | > | > | > |
| 18 | 0010010 | | | | > | > | > | > |
| 17 | 0010001 | | | | > | > | > | > |
| 16 | 0010000 | | | ▓ | > | > | > | > |
| 15 | 0001111 | | | > | > | > | > | > |
| 14 | 0001110 | | | > | > | > | > | > |
| 13 | 0001101 | | | > | > | > | > | > |
| 12 | 0001100 | | | > | > | > | > | > |
| 11 | 0001011 | | | > | > | > | > | > |
| 10 | 0001010 | | | > | > | > | > | > |
| 9 | 0001001 | | | > | > | > | > | > |
| 8 | 0001000 | | | > | > | > | > | > |
| 7 | 0000111 | | | > | > | > | > | > |
| 6 | 0000110 | | | > | > | > | > | > |
| 5 | 0000101 | | | > | > | > | > | > |
| 4 | 0000100 | | | > | > | > | > | > |
| 3 | 0000011 | | | > | > | > | > | > |
| 2 | 0000010 | | | > | > | > | > | > |
| 1 | 0000001 | | | > | > | > | > | > |
| 0 | 0000000 | ▓ | > | > | > | > | > | > |

| | | \multicolumn{7}{c}{7 bits, Vin=62.01} |
|---|---|---|---|---|---|---|---|---|
| | | Step1 | Step2 | Step3 | Step4 | Step5 | Step6 | Step7 |
| 63 | 0111111 | | | | | | | |
| 62 | 0111110 | | | | | | | > |
| 61 | 0111101 | | | | | | > | > |
| 60 | 0111100 | | | | | | > | > |
| 59 | 0111011 | | | | | | > | > |
| 58 | 0111010 | | | | | | > | > |
| 57 | 0111001 | | | | | | > | > |
| 56 | 0111000 | | | | | | > | > |
| 55 | 0110111 | | | | | > | > | > |
| 54 | 0110110 | | | | | > | > | > |
| 53 | 0110101 | | | | | > | > | > |
| 52 | 0110100 | | | | | > | > | > |
| 51 | 0110011 | | | | | > | > | > |
| 50 | 0110010 | | | | | > | > | > |
| 49 | 0110001 | | | | | > | > | > |
| 48 | 0110000 | | | | | > | > | > |
| 47 | 0101111 | | | | > | > | > | > |
| 46 | 0101110 | | | | > | > | > | > |
| 45 | 0101101 | | | | > | > | > | > |
| 44 | 0101100 | | | | > | > | > | > |
| 43 | 0101011 | | | | > | > | > | > |
| 42 | 0101010 | | | | > | > | > | > |
| 41 | 0101001 | | | | > | > | > | > |
| 40 | 0101000 | | | | > | > | > | > |
| 39 | 0100111 | | | > | > | > | > | > |
| 38 | 0100110 | | | > | > | > | > | > |
| 37 | 0100101 | | | > | > | > | > | > |
| 36 | 0100100 | | | > | > | > | > | > |
| 35 | 0100011 | | | > | > | > | > | > |
| 34 | 0100010 | | | > | > | > | > | > |
| 33 | 0100001 | | | > | > | > | > | > |
| 32 | 0100000 | | | > | > | > | > | > |
| 31 | 0011111 | | > | > | > | > | > | > |
| 30 | 0011110 | | > | > | > | > | > | > |
| 29 | 0011101 | | > | > | > | > | > | > |
| 28 | 0011100 | | > | > | > | > | > | > |
| 27 | 0011011 | | > | > | > | > | > | > |
| 26 | 0011010 | | > | > | > | > | > | > |
| 25 | 0011001 | | > | > | > | > | > | > |
| 24 | 0011000 | | > | > | > | > | > | > |
| 23 | 0010111 | | > | > | > | > | > | > |
| 22 | 0010110 | | > | > | > | > | > | > |
| 21 | 0010101 | | > | > | > | > | > | > |
| 20 | 0010100 | | > | > | > | > | > | > |
| 19 | 0010011 | | > | > | > | > | > | > |
| 18 | 0010010 | | > | > | > | > | > | > |
| 17 | 0010001 | | > | > | > | > | > | > |
| 16 | 0010000 | | > | > | > | > | > | > |
| 15 | 0001111 | | > | > | > | > | > | > |
| 14 | 0001110 | | > | > | > | > | > | > |
| 13 | 0001101 | | > | > | > | > | > | > |
| 12 | 0001100 | | > | > | > | > | > | > |
| 11 | 0001011 | | > | > | > | > | > | > |
| 10 | 0001010 | | > | > | > | > | > | > |
| 9 | 0001001 | | > | > | > | > | > | > |
| 8 | 0001000 | | > | > | > | > | > | > |
| 7 | 0000111 | | > | > | > | > | > | > |
| 6 | 0000110 | | > | > | > | > | > | > |
| 5 | 0000101 | | > | > | > | > | > | > |
| 4 | 0000100 | | > | > | > | > | > | > |
| 3 | 0000011 | | > | > | > | > | > | > |
| 2 | 0000010 | | > | > | > | > | > | > |
| 1 | 0000001 | | > | > | > | > | > | > |
| 0 | 0000000 | | > | > | > | > | > | > |

FIG. 4D

| | | 7 bits, Vin=7.01 | | | | | |
|---|---|---|---|---|---|---|---|
| | | Step1 | Step2 | Step3 | Step4 | Step5 | Step6 |
| 63 | 0111111 | | < | < | < | < | < |
| 62 | 0111110 | | < | < | < | < | < |
| 61 | 0111101 | | < | < | < | < | < |
| 60 | 0111100 | | < | < | < | < | < |
| 59 | 0111011 | | < | < | < | < | < |
| 58 | 0111010 | | < | < | < | < | < |
| 57 | 0111001 | | < | < | < | < | < |
| 56 | 0111000 | | < | < | < | < | < |
| 55 | 0110111 | | < | < | < | < | < |
| 54 | 0110110 | | < | < | < | < | < |
| 53 | 0110101 | | < | < | < | < | < |
| 52 | 0110100 | | < | < | < | < | < |
| 51 | 0110011 | | < | < | < | < | < |
| 50 | 0110010 | | < | < | < | < | < |
| 49 | 0110001 | | < | < | < | < | < |
| 48 | 0110000 | | < | < | < | < | < |
| 47 | 0101111 | | < | < | < | < | < |
| 46 | 0101110 | | < | < | < | < | < |
| 45 | 0101101 | | < | < | < | < | < |
| 44 | 0101100 | | < | < | < | < | < |
| 43 | 0101011 | | < | < | < | < | < |
| 42 | 0101010 | | < | < | < | < | < |
| 41 | 0101001 | | < | < | < | < | < |
| 40 | 0101000 | | < | < | < | < | < |
| 39 | 0100111 | | < | < | < | < | < |
| 38 | 0100110 | | < | < | < | < | < |
| 37 | 0100101 | | < | < | < | < | < |
| 36 | 0100100 | | < | < | < | < | < |
| 35 | 0100011 | | < | < | < | < | < |
| 34 | 0100010 | | < | < | < | < | < |
| 33 | 0100001 | | < | < | < | < | < |
| 32 | 0100000 | | < | < | < | < | < |
| 31 | 0011111 | | < | < | < | < | < |
| 30 | 0011110 | | < | < | < | < | < |
| 29 | 0011101 | | < | < | < | < | < |
| 28 | 0011100 | | < | < | < | < | < |
| 27 | 0011011 | | < | < | < | < | < |
| 26 | 0011010 | | < | < | < | < | < |
| 25 | 0011001 | | < | < | < | < | < |
| 24 | 0011000 | | < | < | < | < | < |
| 23 | 0010111 | | < | < | < | < | < |
| 22 | 0010110 | | < | < | < | < | < |
| 21 | 0010101 | | < | < | < | < | < |
| 20 | 0010100 | | < | < | < | < | < |
| 19 | 0010011 | | < | < | < | < | < |
| 18 | 0010010 | | < | < | < | < | < |
| 17 | 0010001 | | < | < | < | < | < |
| 16 | 0010000 | | < | < | < | < | < |
| 15 | 0001111 | | | < | < | < | < |
| 14 | 0001110 | | | < | < | < | < |
| 13 | 0001101 | | | < | < | < | < |
| 12 | 0001100 | | | < | < | < | < |
| 11 | 0001011 | | | < | < | < | < |
| 10 | 0001010 | | | < | < | < | < |
| 9 | 0001001 | | | < | < | < | < |
| 8 | 0001000 | | | < | < | < | < |
| 7 | 0000111 | | | | < | < | < |
| 6 | 0000110 | | | | | < | > |
| 5 | 0000101 | | | | | > | > |
| 4 | 0000100 | | | | < | > | > |
| 3 | 0000011 | | | | > | > | > |
| 2 | 0000010 | | | | > | > | > |
| 1 | 0000001 | | | | > | > | > |
| 0 | 0000000 | | > | > | > | > | > |

| | | Step1 | Step2 | Step3 | Step4 | Step5 | Step6 | Step7 |
|---|---|---|---|---|---|---|---|---|
| | | | | 7 bits, Vin=31.01 | | | | |
| 63 | 0111111 | | | < | < | < | < | < |
| 62 | 0111110 | | | < | < | < | < | < |
| 61 | 0111101 | | | < | < | < | < | < |
| 60 | 0111100 | | | < | < | < | < | < |
| 59 | 0111011 | | | < | < | < | < | < |
| 58 | 0111010 | | | < | < | < | < | < |
| 57 | 0111001 | | | < | < | < | < | < |
| 56 | 0111000 | | | < | < | < | < | < |
| 55 | 0110111 | | | < | < | < | < | < |
| 54 | 0110110 | | | < | < | < | < | < |
| 53 | 0110101 | | | < | < | < | < | < |
| 52 | 0110100 | | | < | < | < | < | < |
| 51 | 0110011 | | | < | < | < | < | < |
| 50 | 0110010 | | | < | < | < | < | < |
| 49 | 0110001 | | | < | < | < | < | < |
| 48 | 0110000 | | | < | < | < | < | < |
| 47 | 0101111 | | | < | < | < | < | < |
| 46 | 0101110 | | | < | < | < | < | < |
| 45 | 0101101 | | | < | < | < | < | < |
| 44 | 0101100 | | | < | < | < | < | < |
| 43 | 0101011 | | | < | < | < | < | < |
| 42 | 0101010 | | | < | < | < | < | < |
| 41 | 0101001 | | | < | < | < | < | < |
| 40 | 0101000 | | | < | < | < | < | < |
| 39 | 0100111 | | | < | < | < | < | < |
| 38 | 0100110 | | | < | < | < | < | < |
| 37 | 0100101 | | | < | < | < | < | < |
| 36 | 0100100 | | | < | < | < | < | < |
| 35 | 0100011 | | | < | < | < | < | < |
| 34 | 0100010 | | | < | < | < | < | < |
| 33 | 0100001 | | | < | < | < | < | < |
| 32 | 0100000 | | | * | < | < | < | < |
| 31 | 0011111 | | | | | | | * |
| 30 | 0011110 | | | | | | * | > |
| 29 | 0011101 | | | | | | > | > |
| 28 | 0011100 | | | | | * | > | > |
| 27 | 0011011 | | | | | > | > | > |
| 26 | 0011010 | | | | | > | > | > |
| 25 | 0011001 | | | | | > | > | > |
| 24 | 0011000 | | | | * | > | > | > |
| 23 | 0010111 | | | | > | > | > | > |
| 22 | 0010110 | | | | > | > | > | > |
| 21 | 0010101 | | | | > | > | > | > |
| 20 | 0010100 | | | | > | > | > | > |
| 19 | 0010011 | | | | > | > | > | > |
| 18 | 0010010 | | | | > | > | > | > |
| 17 | 0010001 | | | | > | > | > | > |
| 16 | 0010000 | | * | > | > | > | > | > |
| 15 | 0001111 | | > | > | > | > | > | > |
| 14 | 0001110 | | > | > | > | > | > | > |
| 13 | 0001101 | | > | > | > | > | > | > |
| 12 | 0001100 | | > | > | > | > | > | > |
| 11 | 0001011 | | > | > | > | > | > | > |
| 10 | 0001010 | | > | > | > | > | > | > |
| 9 | 0001001 | | > | > | > | > | > | > |
| 8 | 0001000 | | > | > | > | > | > | > |
| 7 | 0000111 | | > | > | > | > | > | > |
| 6 | 0000110 | | > | > | > | > | > | > |
| 5 | 0000101 | | > | > | > | > | > | > |
| 4 | 0000100 | | > | > | > | > | > | > |
| 3 | 0000011 | | > | > | > | > | > | > |
| 2 | 0000010 | | > | > | > | > | > | > |
| 1 | 0000001 | | > | > | > | > | > | > |
| 0 | 0000000 | * | > | > | > | > | > | > |

| | | 7 bits, Vin=7.01 | | | | |
|---|---|---|---|---|---|---|
| | | Step1 | Step2 | Step3 | Step4 | Step5 |
| 63 | 0111111 | | < | < | < | < |
| 62 | 0111110 | | < | < | < | < |
| 61 | 0111101 | | < | < | < | < |
| 60 | 0111100 | | < | < | < | < |
| 59 | 0111011 | | < | < | < | < |
| 58 | 0111010 | | < | < | < | < |
| 57 | 0111001 | | < | < | < | < |
| 56 | 0111000 | | < | < | < | < |
| 55 | 0110111 | | < | < | < | < |
| 54 | 0110110 | | < | < | < | < |
| 53 | 0110101 | | < | < | < | < |
| 52 | 0110100 | | < | < | < | < |
| 51 | 0110011 | | < | < | < | < |
| 50 | 0110010 | | < | < | < | < |
| 49 | 0110001 | | < | < | < | < |
| 48 | 0110000 | | < | < | < | < |
| 47 | 0101111 | | < | < | < | < |
| 46 | 0101110 | | < | < | < | < |
| 45 | 0101101 | | < | < | < | < |
| 44 | 0101100 | | < | < | < | < |
| 43 | 0101011 | | < | < | < | < |
| 42 | 0101010 | | < | < | < | < |
| 41 | 0101001 | | < | < | < | < |
| 40 | 0101000 | | < | < | < | < |
| 39 | 0100111 | | < | < | < | < |
| 38 | 0100110 | | < | < | < | < |
| 37 | 0100101 | | < | < | < | < |
| 36 | 0100100 | | < | < | < | < |
| 35 | 0100011 | | < | < | < | < |
| 34 | 0100010 | | < | < | < | < |
| 33 | 0100001 | | < | < | < | < |
| 32 | 0100000 | | < | < | < | < |
| 31 | 0011111 | | < | < | < | < |
| 30 | 0011110 | | < | < | < | < |
| 29 | 0011101 | | < | < | < | < |
| 28 | 0011100 | | < | < | < | < |
| 27 | 0011011 | | < | < | < | < |
| 26 | 0011010 | | < | < | < | < |
| 25 | 0011001 | | < | < | < | < |
| 24 | 0011000 | | < | < | < | < |
| 23 | 0010111 | | < | < | < | < |
| 22 | 0010110 | | < | < | < | < |
| 21 | 0010101 | | < | < | < | < |
| 20 | 0010100 | | < | < | < | < |
| 19 | 0010011 | | < | < | < | < |
| 18 | 0010010 | | < | < | < | < |
| 17 | 0010001 | | < | < | < | < |
| 16 | 0010000 | | < | < | < | < |
| 15 | 0001111 | | < | < | < | < |
| 14 | 0001110 | | < | < | < | < |
| 13 | 0001101 | | < | < | < | < |
| 12 | 0001100 | | < | < | < | < |
| 11 | 0001011 | | < | < | < | < |
| 10 | 0001010 | | < | < | < | < |
| 9 | 0001001 | | < | < | < | < |
| 8 | 0001000 | | ▓ | < | < | < |
| 7 | 0000111 | | | | | ▓ |
| 6 | 0000110 | | | | ▓ | > |
| 5 | 0000101 | | | | > | > |
| 4 | 0000100 | | | ▓ | > | > |
| 3 | 0000011 | | | > | > | > |
| 2 | 0000010 | | | > | > | > |
| 1 | 0000001 | | | > | > | > |
| 0 | 0000000 | ▓ | > | > | > | > |

| | | Step1 | Step2 | Step3 | Step4 | Step5 | Step6 | Step7 |
|---|---|---|---|---|---|---|---|---|
| | | | | 7 bits, Vin=15.01 | | | | |
| 63 | 0111111 | | | < | < | < | < | < |
| 62 | 0111110 | | | < | < | < | < | < |
| 61 | 0111101 | | | < | < | < | < | < |
| 60 | 0111100 | | | < | < | < | < | < |
| 59 | 0111011 | | | < | < | < | < | < |
| 58 | 0111010 | | | < | < | < | < | < |
| 57 | 0111001 | | | < | < | < | < | < |
| 56 | 0111000 | | | < | < | < | < | < |
| 55 | 0110111 | | | < | < | < | < | < |
| 54 | 0110110 | | | < | < | < | < | < |
| 53 | 0110101 | | | < | < | < | < | < |
| 52 | 0110100 | | | < | < | < | < | < |
| 51 | 0110011 | | | < | < | < | < | < |
| 50 | 0110010 | | | < | < | < | < | < |
| 49 | 0110001 | | | < | < | < | < | < |
| 48 | 0110000 | | | < | < | < | < | < |
| 47 | 0101111 | | | < | < | < | < | < |
| 46 | 0101110 | | | < | < | < | < | < |
| 45 | 0101101 | | | < | < | < | < | < |
| 44 | 0101100 | | | < | < | < | < | < |
| 43 | 0101011 | | | < | < | < | < | < |
| 42 | 0101010 | | | < | < | < | < | < |
| 41 | 0101001 | | | < | < | < | < | < |
| 40 | 0101000 | | | < | < | < | < | < |
| 39 | 0100111 | | | < | < | < | < | < |
| 38 | 0100110 | | | < | < | < | < | < |
| 37 | 0100101 | | | < | < | < | < | < |
| 36 | 0100100 | | | < | < | < | < | < |
| 35 | 0100011 | | | < | < | < | < | < |
| 34 | 0100010 | | | < | < | < | < | < |
| 33 | 0100001 | | | < | < | < | < | < |
| 32 | 0100000 | | | ▓ | < | < | < | < |
| 31 | 0011111 | | | | < | < | < | < |
| 30 | 0011110 | | | | < | < | < | < |
| 29 | 0011101 | | | | < | < | < | < |
| 28 | 0011100 | | | | < | < | < | < |
| 27 | 0011011 | | | | < | < | < | < |
| 26 | 0011010 | | | | < | < | < | < |
| 25 | 0011001 | | | | < | < | < | < |
| 24 | 0011000 | | | | < | < | < | < |
| 23 | 0010111 | | | | < | < | < | < |
| 22 | 0010110 | | | | < | < | < | < |
| 21 | 0010101 | | | | < | < | < | < |
| 20 | 0010100 | | | | < | < | < | < |
| 19 | 0010011 | | | | < | < | < | < |
| 18 | 0010010 | | | | < | < | < | < |
| 17 | 0010001 | | | | < | < | < | < |
| 16 | 0010000 | | | | ▓ | < | < | < |
| 15 | 0001111 | | | | | | | ▓ |
| 14 | 0001110 | | | | | | ▓ | > |
| 13 | 0001101 | | | | | | > | > |
| 12 | 0001100 | | | | | ▓ | > | > |
| 11 | 0001011 | | | | | > | > | > |
| 10 | 0001010 | | | | | > | > | > |
| 9 | 0001001 | | | | | > | > | > |
| 8 | 0001000 | | ▓ | > | > | > | > | > |
| 7 | 0000111 | | > | > | > | > | > | > |
| 6 | 0000110 | | > | > | > | > | > | > |
| 5 | 0000101 | | > | > | > | > | > | > |
| 4 | 0000100 | | > | > | > | > | > | > |
| 3 | 0000011 | | > | > | > | > | > | > |
| 2 | 0000010 | | > | > | > | > | > | > |
| 1 | 0000001 | | > | > | > | > | > | > |
| 0 | 0000000 | ▓ | > | > | > | > | > | > |

| | | 7 bits, Vin=15.01 | | | | | |
|---|---|---|---|---|---|---|---|
| | | Step1 | Step2 | Step3 | Step4 | Step5 | Step6 |
| 63 | 0111111 | | | < | < | < | < |
| 62 | 0111110 | | | < | < | < | < |
| 61 | 0111101 | | | < | < | < | < |
| 60 | 0111100 | | | < | < | < | < |
| 59 | 0111011 | | | < | < | < | < |
| 58 | 0111010 | | | < | < | < | < |
| 57 | 0111001 | | | < | < | < | < |
| 56 | 0111000 | | | < | < | < | < |
| 55 | 0110111 | | | < | < | < | < |
| 54 | 0110110 | | | < | < | < | < |
| 53 | 0110101 | | | < | < | < | < |
| 52 | 0110100 | | | < | < | < | < |
| 51 | 0110011 | | | < | < | < | < |
| 50 | 0110010 | | | < | < | < | < |
| 49 | 0110001 | | | < | < | < | < |
| 48 | 0110000 | | | < | < | < | < |
| 47 | 0101111 | | | < | < | < | < |
| 46 | 0101110 | | | < | < | < | < |
| 45 | 0101101 | | | < | < | < | < |
| 44 | 0101100 | | | < | < | < | < |
| 43 | 0101011 | | | < | < | < | < |
| 42 | 0101010 | | | < | < | < | < |
| 41 | 0101001 | | | < | < | < | < |
| 40 | 0101000 | | | < | < | < | < |
| 39 | 0100111 | | | < | < | < | < |
| 38 | 0100110 | | | < | < | < | < |
| 37 | 0100101 | | | < | < | < | < |
| 36 | 0100100 | | | < | < | < | < |
| 35 | 0100011 | | | < | < | < | < |
| 34 | 0100010 | | | < | < | < | < |
| 33 | 0100001 | | | < | < | < | < |
| 32 | 0100000 | | | < | < | < | < |
| 31 | 0011111 | | | < | < | < | < |
| 30 | 0011110 | | | < | < | < | < |
| 29 | 0011101 | | | < | < | < | < |
| 28 | 0011100 | | | < | < | < | < |
| 27 | 0011011 | | | < | < | < | < |
| 26 | 0011010 | | | < | < | < | < |
| 25 | 0011001 | | | < | < | < | < |
| 24 | 0011000 | | | < | < | < | < |
| 23 | 0010111 | | | < | < | < | < |
| 22 | 0010110 | | | < | < | < | < |
| 21 | 0010101 | | | < | < | < | < |
| 20 | 0010100 | | | < | < | < | < |
| 19 | 0010011 | | | < | < | < | < |
| 18 | 0010010 | | | < | < | < | < |
| 17 | 0010001 | | | < | < | < | < |
| 16 | 0010000 | | | ▓ | < | < | < |
| 15 | 0001111 | | | | | | ▓ |
| 14 | 0001110 | | | | | ▓ | > |
| 13 | 0001101 | | | | | > | > |
| 12 | 0001100 | | | | ▓ | > | > |
| 11 | 0001011 | | | | > | > | > |
| 10 | 0001010 | | | | > | > | > |
| 9 | 0001001 | | | | > | > | > |
| 8 | 0001000 | | ▓ | > | > | > | > |
| 7 | 0000111 | | > | > | > | > | > |
| 6 | 0000110 | | > | > | > | > | > |
| 5 | 0000101 | | > | > | > | > | > |
| 4 | 0000100 | | > | > | > | > | > |
| 3 | 0000011 | | > | > | > | > | > |
| 2 | 0000010 | | > | > | > | > | > |
| 1 | 0000001 | | > | > | > | > | > |
| 0 | 0000000 | ▓ | > | > | > | > | > |

FIG. 7A

| | | Step1 | Step2 | Step3 | Step4 | Step5 | Step6 | Step7 | Step8 |
|---|---|---|---|---|---|---|---|---|---|
| | | | | 7 bits, Vin=31.01 | | | | | |
| 63 | 0111111 | | | | < | < | < | < | < |
| 62 | 0111110 | | | | < | < | < | < | < |
| 61 | 0111101 | | | | < | < | < | < | < |
| 60 | 0111100 | | | | < | < | < | < | < |
| 59 | 0111011 | | | | < | < | < | < | < |
| 58 | 0111010 | | | | < | < | < | < | < |
| 57 | 0111001 | | | | < | < | < | < | < |
| 56 | 0111000 | | | | < | < | < | < | < |
| 55 | 0110111 | | | | < | < | < | < | < |
| 54 | 0110110 | | | | < | < | < | < | < |
| 53 | 0110101 | | | | < | < | < | < | < |
| 52 | 0110100 | | | | < | < | < | < | < |
| 51 | 0110011 | | | | < | < | < | < | < |
| 50 | 0110010 | | | | < | < | < | < | < |
| 49 | 0110001 | | | | < | < | < | < | < |
| 48 | 0110000 | | | | < | < | < | < | < |
| 47 | 0101111 | | | | < | < | < | < | < |
| 46 | 0101110 | | | | < | < | < | < | < |
| 45 | 0101101 | | | | < | < | < | < | < |
| 44 | 0101100 | | | | < | < | < | < | < |
| 43 | 0101011 | | | | < | < | < | < | < |
| 42 | 0101010 | | | | < | < | < | < | < |
| 41 | 0101001 | | | | < | < | < | < | < |
| 40 | 0101000 | | | | < | < | < | < | < |
| 39 | 0100111 | | | | < | < | < | < | < |
| 38 | 0100110 | | | | < | < | < | < | < |
| 37 | 0100101 | | | | < | < | < | < | < |
| 36 | 0100100 | | | | < | < | < | < | < |
| 35 | 0100011 | | | | < | < | < | < | < |
| 34 | 0100010 | | | | < | < | < | < | < |
| 33 | 0100001 | | | | < | < | < | < | < |
| 32 | 0100000 | | | | ■ | < | < | < | < |
| 31 | 0011111 | | | | | | | | ■ |
| 30 | 0011110 | | | | | | | ■ | > |
| 29 | 0011101 | | | | | | | > | > |
| 28 | 0011100 | | | | | | ■ | > | > |
| 27 | 0011011 | | | | | | > | > | > |
| 26 | 0011010 | | | | | | > | > | > |
| 25 | 0011001 | | | | | | > | > | > |
| 24 | 0011000 | | | | | ■ | > | > | > |
| 23 | 0010111 | | | | | > | > | > | > |
| 22 | 0010110 | | | | | > | > | > | > |
| 21 | 0010101 | | | | | > | > | > | > |
| 20 | 0010100 | | | | | > | > | > | > |
| 19 | 0010011 | | | | | > | > | > | > |
| 18 | 0010010 | | | | | > | > | > | > |
| 17 | 0010001 | | | | | > | > | > | > |
| 16 | 0010000 | | | ■ | > | > | > | > | > |
| 15 | 0001111 | | | > | > | > | > | > | > |
| 14 | 0001110 | | | > | > | > | > | > | > |
| 13 | 0001101 | | | > | > | > | > | > | > |
| 12 | 0001100 | | | > | > | > | > | > | > |
| 11 | 0001011 | | | > | > | > | > | > | > |
| 10 | 0001010 | | | > | > | > | > | > | > |
| 9 | 0001001 | | | > | > | > | > | > | > |
| 8 | 0001000 | | ■ | > | > | > | > | > | > |
| 7 | 0000111 | | > | > | > | > | > | > | > |
| 6 | 0000110 | | > | > | > | > | > | > | > |
| 5 | 0000101 | | > | > | > | > | > | > | > |
| 4 | 0000100 | | > | > | > | > | > | > | > |
| 3 | 0000011 | | > | > | > | > | > | > | > |
| 2 | 0000010 | | > | > | > | > | > | > | > |
| 1 | 0000001 | | > | > | > | > | > | > | > |
| 0 | 0000000 | ■ | > | > | > | > | > | > | > |

SUCCESSIVE APPROXIMATION ANALOG-TO-DIGITAL CONVERTER (ADC) WITH DYNAMIC SEARCH ALGORITHM

CLAIM OF PRIORITY

This patent application is a continuation of U.S. patent application Ser. No. 14/558,004, filed Dec. 2, 2014, which is a continuation of U.S. patent application Ser. No. 14/248, 851, filed Apr. 9, 2014, which makes reference to, claims priority to and claims benefit from the U.S. Provisional Patent Application Ser. No. 61/809,926, filed on Apr. 9, 2013. The above stated applications are hereby incorporated herein by reference in their entirety.

TECHNICAL FIELD

Certain embodiments of the invention relate to analog-to-digital converters (ADCs). More specifically, certain embodiments of the invention relate to methods and systems successive approximation ADCs and searches performed by successive approximation ADCs.

BACKGROUND

Existing analog-to-digital converters (ADCs) can be too slow and/or power hungry. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Systems and/or methods are provided for a successive approximation analog-to-digital converter (ADC) with a dynamic search algorithm, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 4A-4D illustrates an example search that may be performed by the successive approximation ADC of FIG. 2 per the process of the FIG. 3.

FIG. 5A-5D illustrates another example search that may be performed by the successive approximation ADC of FIG. 2 per the process of the FIG. 3.

FIG. 6A-6D illustrates yet another example search that may be performed by the successive approximation ADC of FIG. 2 per the process of the FIG. 3.

FIG. 7A-7C illustrates a further example search that may be performed by the successive approximation ADC of FIG. 2 per the process of the FIG. 3.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Aspects of the invention include an analog-to-digital converter (ADC) customized for use in systems, such as communication systems, where much of the dynamic range of the ADC is present only to avoid clipping in the event of infrequent peaks (e.g., resulting from blocker signals). Because the signals whose amplitudes range into the higher digital codes are typically unwanted blocker signals, larger amounts of quantization noise may be tolerable at such signal levels.

Figure 1:
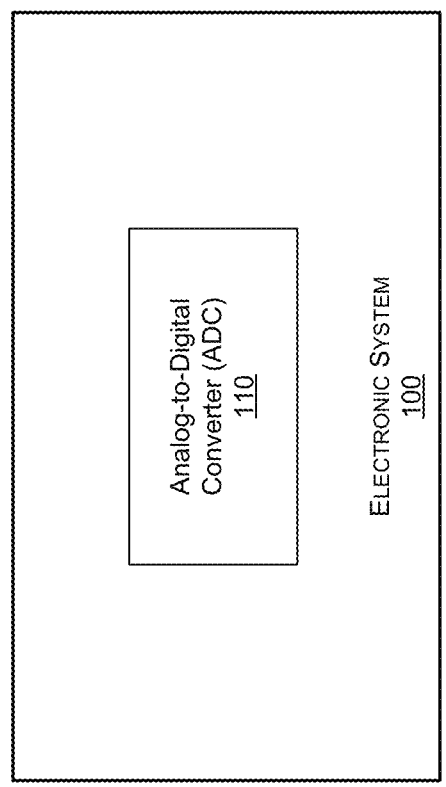
FIG. 1 illustrates an example electronic system that may be operable to perform analog-to-digital conversions.

FIG. 1 illustrates an example electronic system 100 that may be operable to perform analog-to-digital conversion. The electronic system 100 may comprise suitable circuitry, interfaces, logic and/or code for implementing various aspects of the present disclosure. In this regard, the electronic system 100 may be configured to support performing, executing or running various operations, functions, applications and/or services. For example, the electronic system 100 may be used for executing computer programs, playing video and/or audio content, gaming, communication applications or services (e.g., Internet access/browsing, email, text messaging, chatting and/or voice calling services), and/or networking services (e.g., WiFi hotspot, Bluetooth piconet, and/or active 3G/femtocell data channels).

In some instances, the electronic system 100 may be configured to enable and/or support communication of data. In this regard, the electronic system 100 may communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols.

Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), direct broadcast satellite (DBS), microwave backhaul, and/or the like. Examples of wired protocols and/or interfaces that may be supported and/or used by the communication subsystem 250 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow user interactions that may control services provided by the electronic system 100. In this regard, the electronic system 100 may comprise components or subsystems for enabling interactions with a user (e.g., end-user or installer), so as to obtain user input and/or to provide user output.

The electronic system 100 may be a stationary system (i.e. being installed at, and/or configured for use only in particular location). In other instances, however, the electronic system 100 may be a mobile device—i.e., intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), personal computers (e.g., laptops or desktops), servers, dedicated multimedia devices (e.g., televisions, game consoles, or portable media players), DBS outdoor units, DBS indoor units (e.g., "set-top boxes"), microwave backhaul outdoor units, microwave backhaul indoor units, or other similar receiver systems, and the like. The disclosure, however, is not limited to any particular type of electronic system.

In operation, the electronic system 100 may be operable to perform various operations, functions, applications and/or services. In this regard, in some instances, performing the various, operations, functions, application or services supported by the electronic system 100 may entail performing various processing operations on data handled by the electronic system 100. For example, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme.

Accordingly, handling of digital communications may typically require performing, among other things, analog-to-digital conversion at the receiving end. In this regard, the system 100 may include a successive approximation ADC 110. The ADC 110 may comprise circuitry, interfaces, logic and/or code for performing analog-to-digital conversions. To this end, the ADC 110 may use a dynamic algorithm for choosing analog reference voltages against which to compare an analog input voltage to be converted to a digital code. The search algorithm may be dynamic in that, for example, a sequence of reference voltages used for a conversion may be selected based on characteristics of the current input signal being converted and/or past converted input signals. The search algorithm may be dynamic in that, for example, a sequence of reference voltages used for a conversion may change from one conversion (or set of conversions) to the next.

In an example implementation, the sequence of reference voltages may be selected based on characteristics of the signal to be converted. Characteristics of the signal may include, for example, signal to noise ratio (SNR), peak-to-average power ratio (PAPR), and/or the like. Characteristics of the signal may include, for example, a cumulative distribution function (CDF) or histogram of the signal being digitized. The sequence of reference voltages may also be selected based on any other suitable factors such as, for example, process variations, voltage variations, temperature variations, and/or the like. Furthermore, the sequence of reference voltages may be selected according to a search algorithm such as, for example, a binary search algorithm, a non-binary search algorithm, and a partial binary search algorithm.

Figure 2:
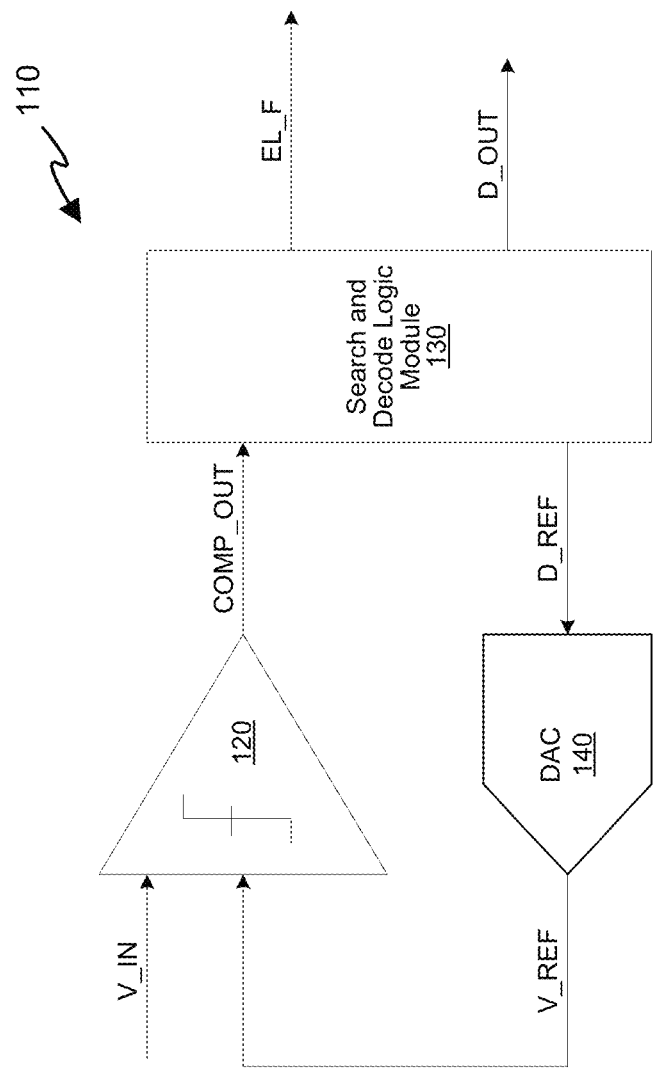
FIG. 2 is a diagram illustrating an example successive approximation ADC.

Referring now to FIG. 2, a block diagram is shown that illustrates an example ADC 110, in connection with various exemplary aspects of the invention. As shown, the ADC 110 may include a comparator 120, a search and decode logic module 130, and a digital-to-analog converter (DAC) 140.

The comparator 120 may comprise suitable logic, circuitry, interfaces and/or code that may be operable to generate an output signal or code COMP_OUT based on analog input voltage V_IN and an analog reference voltage V_REF generated by the DAC 140. In this regard, the comparator 120 may be operable to generate the output signal COMP_OUT such that it indicates whether the analog input voltage V_IN has a predetermined relationship (e.g., greater than) to the analog reference voltage V_REF generated by the DAC 140. To this end, the comparator 120 may comprise an analog voltage comparator.

The search and decode logic module 130 may comprise suitable logic, circuitry, interfaces and/or code that may be operable to perform a search of the bits that form a digital reference voltage code D_REF based on the output signal COMP_OUT from the comparator 120. Moreover, the search and decode logic module 130 may provide the generated digital reference voltage code D_REF to the DAC 140. In this regard, the search and decode logic module 130 may be operable to search for a reference voltage code D_REF that causes the DAC 140 to produce an analog reference voltage V_REF that approximates the analog input voltage V_IN. To this end, the search and decode logic module 30 may comprise search and decode circuitry that iterates or searches through the range of possible digital reference voltage codes D_REF in accordance with a particular search algorithm and/or particular search criteria. The manner by which the search and decode logic module 130 may iterate through the range of possible digital reference codes D_REF is explained in greater detail below.

Besides generating the digital reference voltage code D_REF, the search and decode logic module 130 may further generate and output an early/late flag EL_F that indicates whether the search and decode logic module 130 obtained a digital output code D_OUT that is representative of the analog input voltage V_IN early or late with respect to a base line number of steps. In particular, the search and decode logic module 130 may generate the early/late flag EL_F such that it indicates, for example, that the digital output code D_OUT was obtained 1 step early, 1 step late, 2 steps early, 2 steps late, or some other indication.

The DAC 140 may comprise suitable logic, circuitry, interfaces and/or code that may be operable to generate the analog reference voltage V_REF, based on a digital reference voltage code D_REF received from the search and decode logic module 130. As shown, the DAC 140 may communicate the generated analog reference voltage V_REF to the comparator 120.

Figure 3:
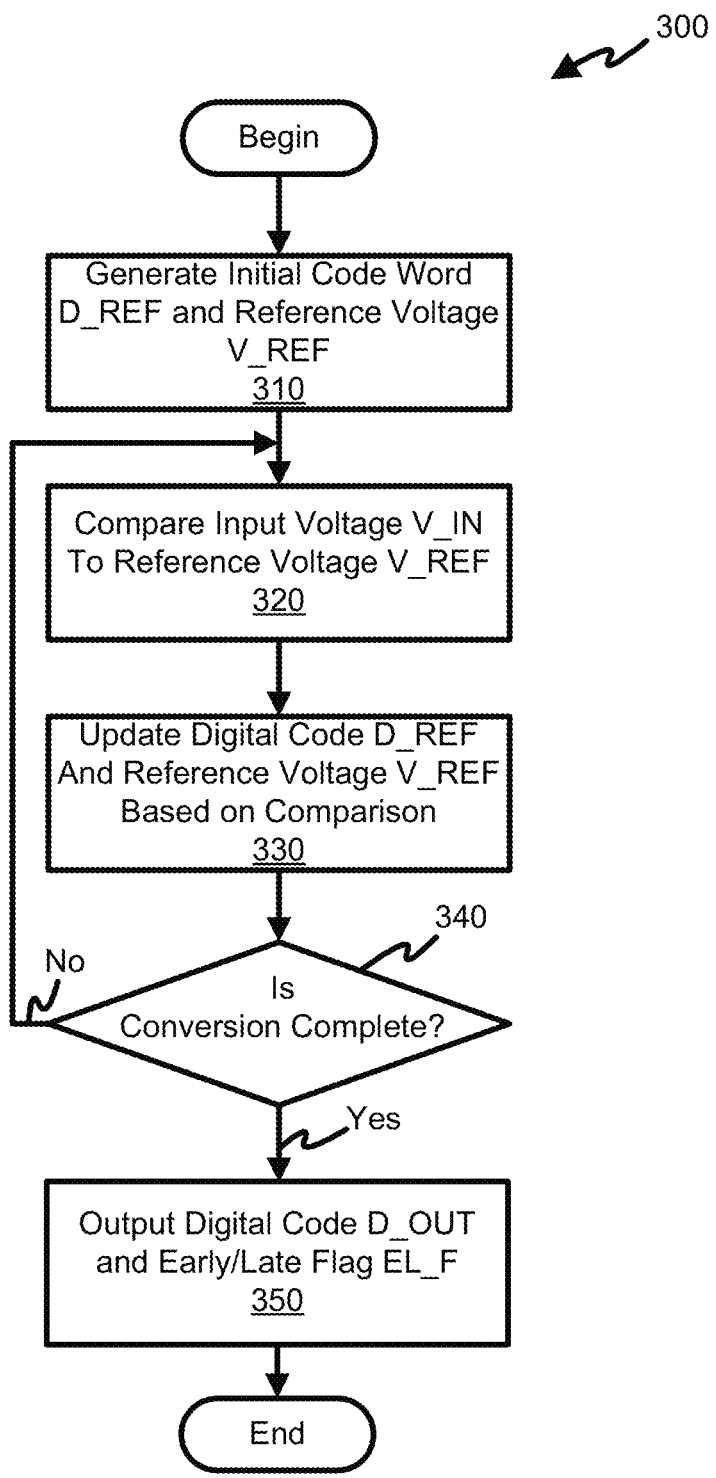
FIG. 3 is a flow chart illustrating an example process used by the successive approximation ADC of FIG. 2 to obtain a digital code word representative of an analog input voltage.

Referring now to FIG. 3, an example method 300 is depicted that may be implemented by the ADC 110 to generate a digital output code D_OUT that is representative of an analog input voltage V_IN. At 310, the search and decode logic module 130 may cause the DAC 140 to generate an initial reference voltage V_REF. To this end, the search and decode logic module 130 may generate an initial digital reference voltage code D_REF for the DAC 140 which causes the DAC 140 to generate a corresponding analog reference voltage V_REF. At 320, the comparator 120 may compare the analog input voltage V_IN with the analog reference voltage V_REF produced by the DAC 140. Based on such comparison, the comparator 120 may provide the search and decode logic module 130 with a comparison output signal COMP_OUT that is indicative of whether the analog input voltage V_IN has a predetermined relationship (e.g., greater than) to the analog reference voltage V_REF.

At 330, the search and decode logic module 130 may update the analog reference voltage V_REF based upon the comparison output signal COMP_OUT received from the comparator 120 and various search criteria discussed below. To this end, the search and decode logic module 130 may update the digital reference voltage code D_REF that is supplied to the DAC 140 based on the comparison output signal COMP_OUT and search criteria, thus causing the DAC 140 to generate a correspond analog reference voltage V_REF. At 330, the search and decode logic module 120 may determine whether the search for a suitable digital output code D_OUT to represent the analog input voltage V_IN is complete. In response to determining the search is complete, the search and decode logic module 120 at 340 may output the digital reference voltage code D_REF via the digital output D_OUT and output an early/late flag via flag output EL_F. If the search is not complete, the search and decode logic module 120 may return to 320 so that the comparator 120 may compare the analog input voltage V_IN to the updated reference voltage V_REF that was generated by the DAC 140 per the updated digital reference voltage code D_REF. In this regard, the search and decode logic module 130 may search for the a digital code D_REF, D_OUT that causes the DAC 140 to produce an analog reference voltage V_REF that is close to the analog input voltage V_IN.

Referring now to FIGS. 4A-4D, one manner of converting analog input voltages V_IN of 7.01*VLSB (VLSB being the voltage corresponding to the least significant bit of the digital code V_REF, D_OUT), 15.01*VLSB, 31.01*VLSB, and 62.01*VLSB to 7-bit digital code words D_REF, D_OUT per method 300 is shown. In particular, FIGS. 4A-4D depict an exhaustive binary search used by the search and decode logic module 130 that includes seven comparisons or steps to complete each conversion. As shown, after a comparison with zero to determine whether V_IN is positive or negative, the search and decode logic module 130 in FIGS. 4A-4D uses an second analog reference voltage V_REF of 32*VLSB. From this second analog reference voltage V_REF, the search and decode logic module 130 may conduct a binary search to obtain a 7-bit digital code word D_REF, D_OUT having 1-LSB accuracy in seven steps.

FIGS. 5A-5D, illustrate another manner of converting analog input voltages V_IN of 7.01*VLSB, 15.01*VLSB, 31.01*VLSB, and 62.01*VLSB to 7-bit digital codes D_REF, D_OUT having 1-LSB accuracy per method 300. In FIGS. 5A-5D, the search and decode logic 130 selects 16*VLSB (⅛ full-scale) as the second analog reference voltage V_REF rather than 32*VLSB (¼ full scale) as shown in FIGS. 4A-4D. The second reference voltage V_REF of 16*VLSB may have been selected based, for example, on characteristics of the analog input signal V_IN to be digitized. For example, the second reference voltage V_REF of 16*VLSB may have been selected because the probability of the analog input voltage V_IN having a magnitude less than 16*VLSB is greater than a threshold probability T, where the threshold probability T is selected based, for example, on a desired tradeoff between power consumption, speed, and/or accuracy of conversions.

Figure 4A:
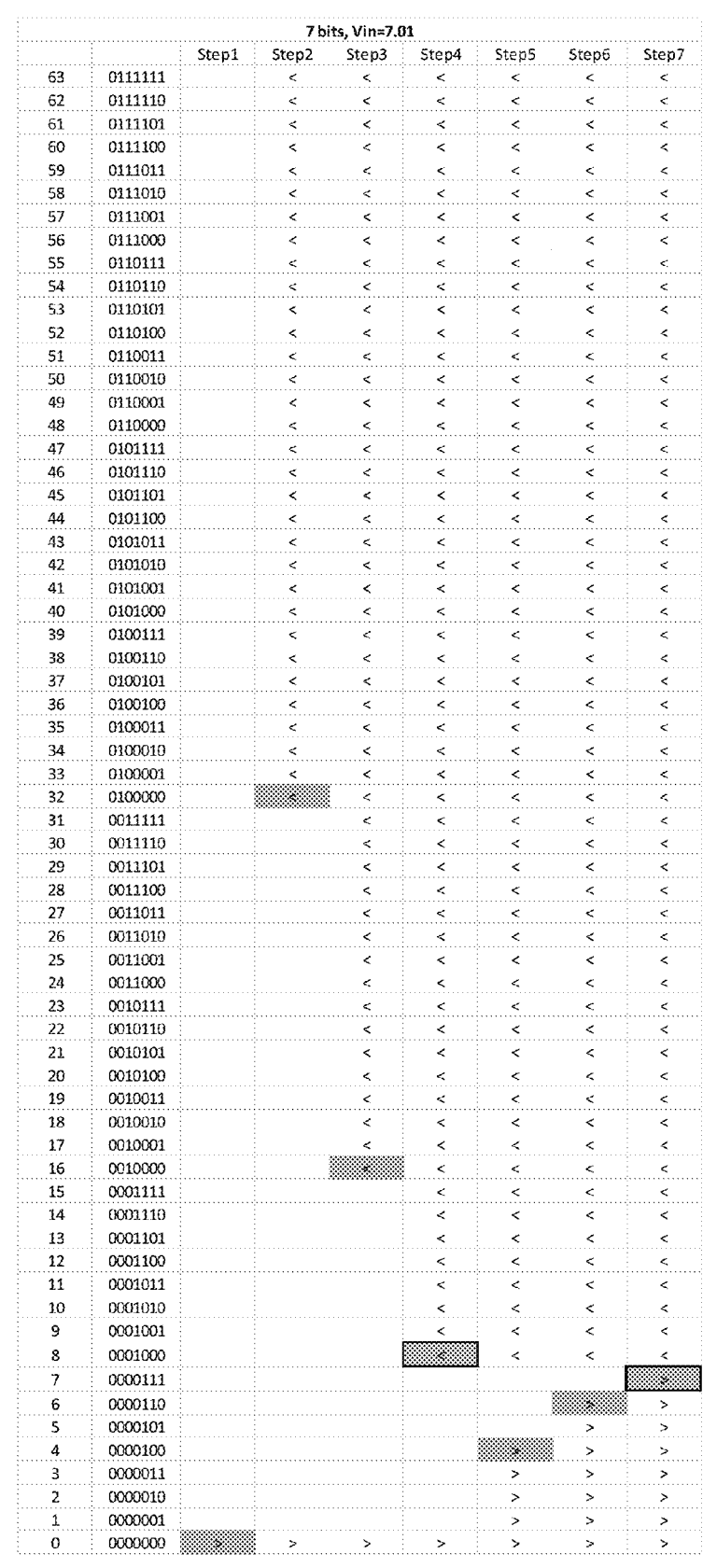
Figure 5B:
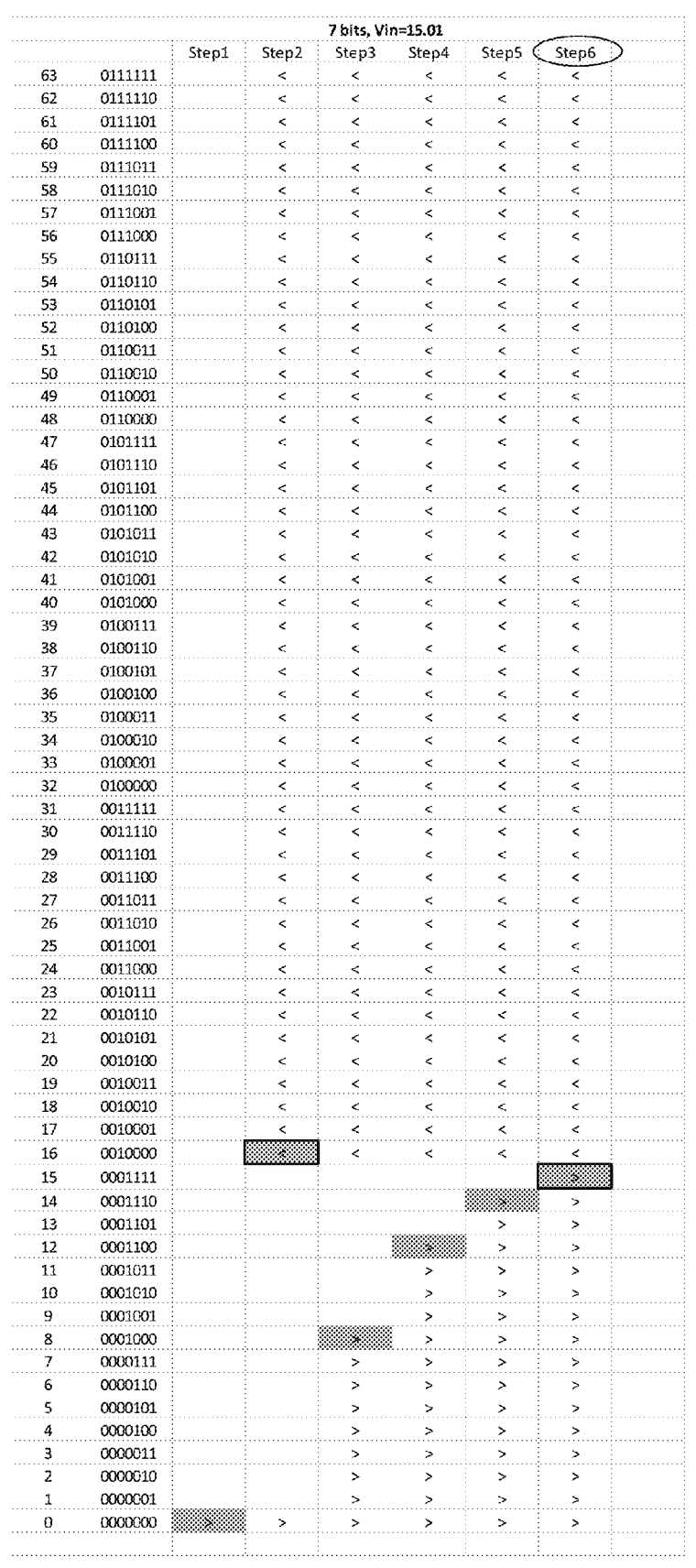
Figure 5D:
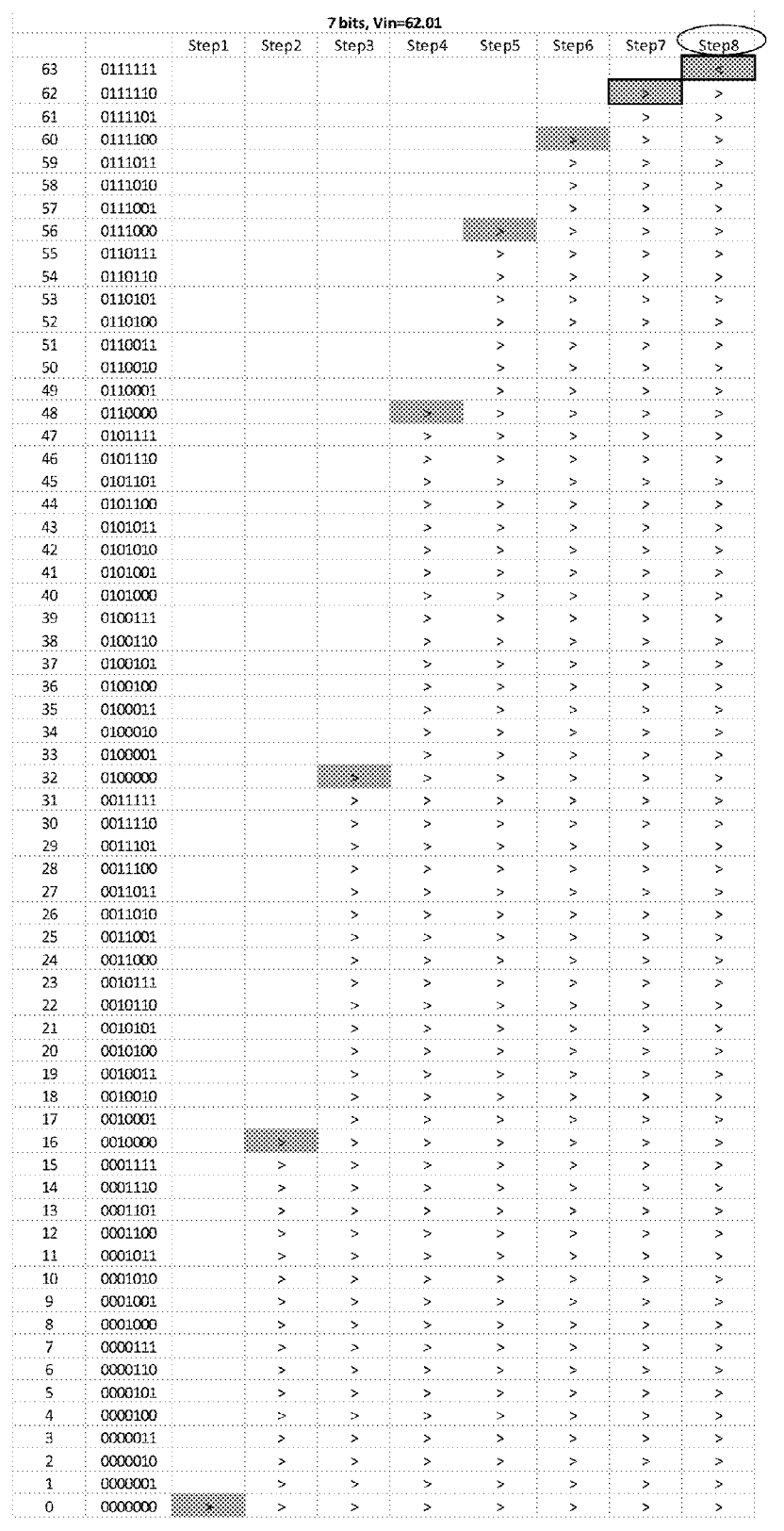

It can be seen in FIGS. 5A and 5B that, where the sample to be digitized adheres to the probabilities and is in fact below the second reference voltage V_REF of 16*VLSB, then the ADC 110 completes the conversion to 1-LSB accuracy in six steps, rather than the seven steps used in FIGS. 4A and 4B. In FIG. 5C, however, the sample to be digitized is greater than second reference voltage V_REF of 16*VLSB. Consequently, the ADC 110 per method 300 requires seven steps to obtain the 7-bit digital word D_REF, D_OUT to 1-LSB accuracy, as it did in FIG. 4C. As for FIG. 5D, the sample to be digitized is also greater than 16*VLSB. However, this time the ADC 110 per method 300 requires eight steps to obtain the 7-bit digital code word D_REF, D_OUT to 1-LSB accuracy—one more step than the conversion depicted in FIGS. 4C and 5D.

FIGS. 6A-6D, illustrate another manner of converting analog input voltages V_IN of 7.01*VLSB, 15.01*VLSB, 31.01*VLSB, and 62.01*VLSB to 7-bit digital code words D_REF, D_OUT per method 300. In FIGS. 6A-6D, the search and decode logic module 130 selects 8*VLSB (1/16 full-scale) as the second analog reference voltage V_REF rather than 32*VLSB (¼ full scale) as shown in FIGS. 4A-4D. The second reference voltage V_REF of 8*VLSB may have been selected based, for example, on characteristics of the signal to be digitized. For example, the second reference voltage V_REF of 8*VLSB may have been selected as the second reference voltage because the probability of the magnitude being less than 8*VLSB is greater than a threshold probability T, where the threshold probability T is selected based, for example, on a desired tradeoff between power consumption, speed, and/or accuracy of conversions.

It can be seen in FIG. 6A that, where the sample to be digitized adheres to the probabilities and is in fact below the second reference voltage V_REF of 8*VLSB, then the ADC 110 may complete the conversion to 1-LSB accuracy in five steps, rather than the seven steps used in FIG. 4A. In FIG. 6B, however, the sample to be digitized is greater than the second reference voltage V_REF of 8*VLSB. Consequently, the ADC 110 per method 300 requires seven steps to obtain the 7-bit digital code word D_REF, D_OUT to 1-LSB accuracy—the same number of steps as the conversion depicted in FIG. 4B.

Figure 6C:
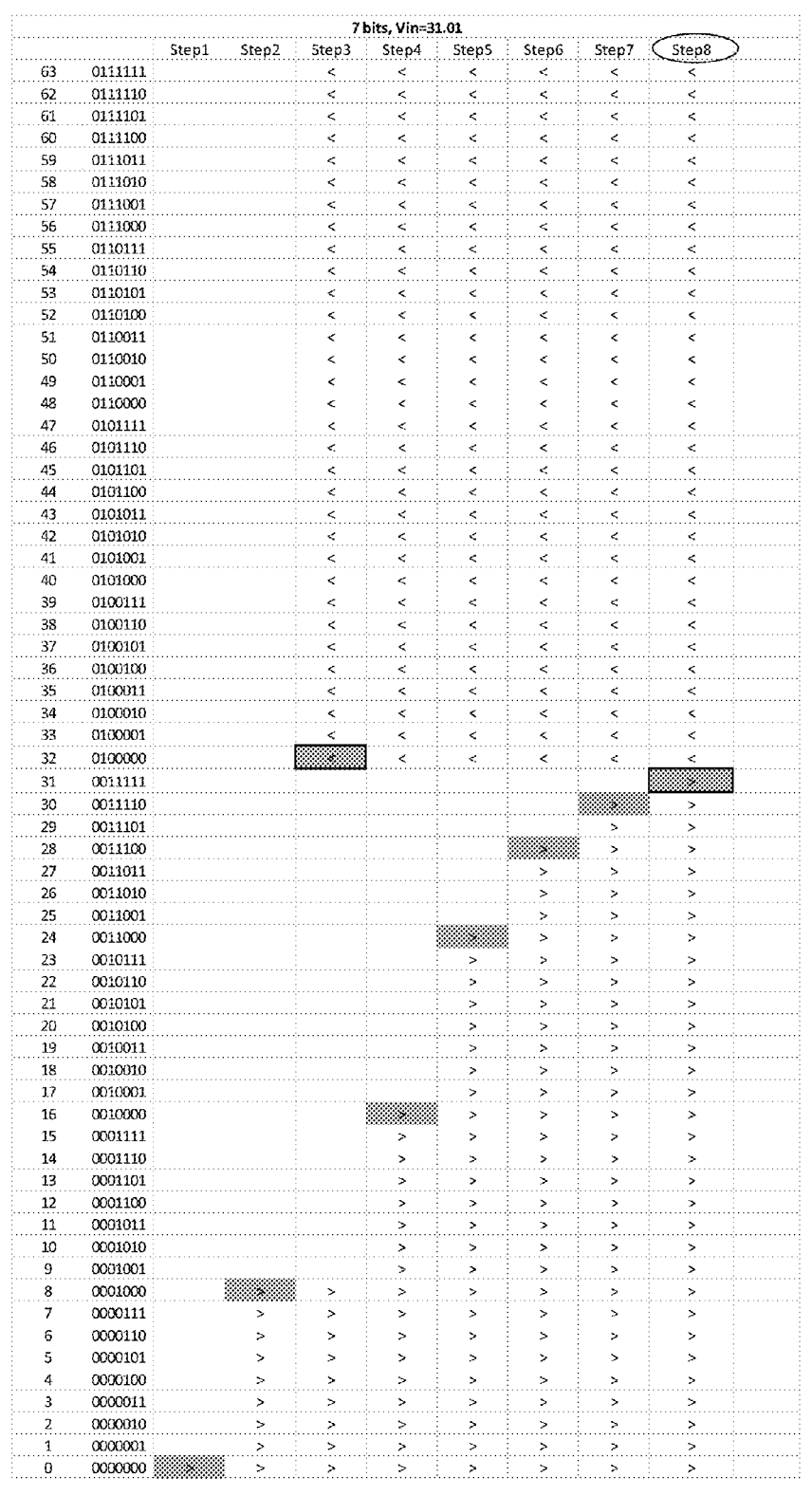
Figure 6D:
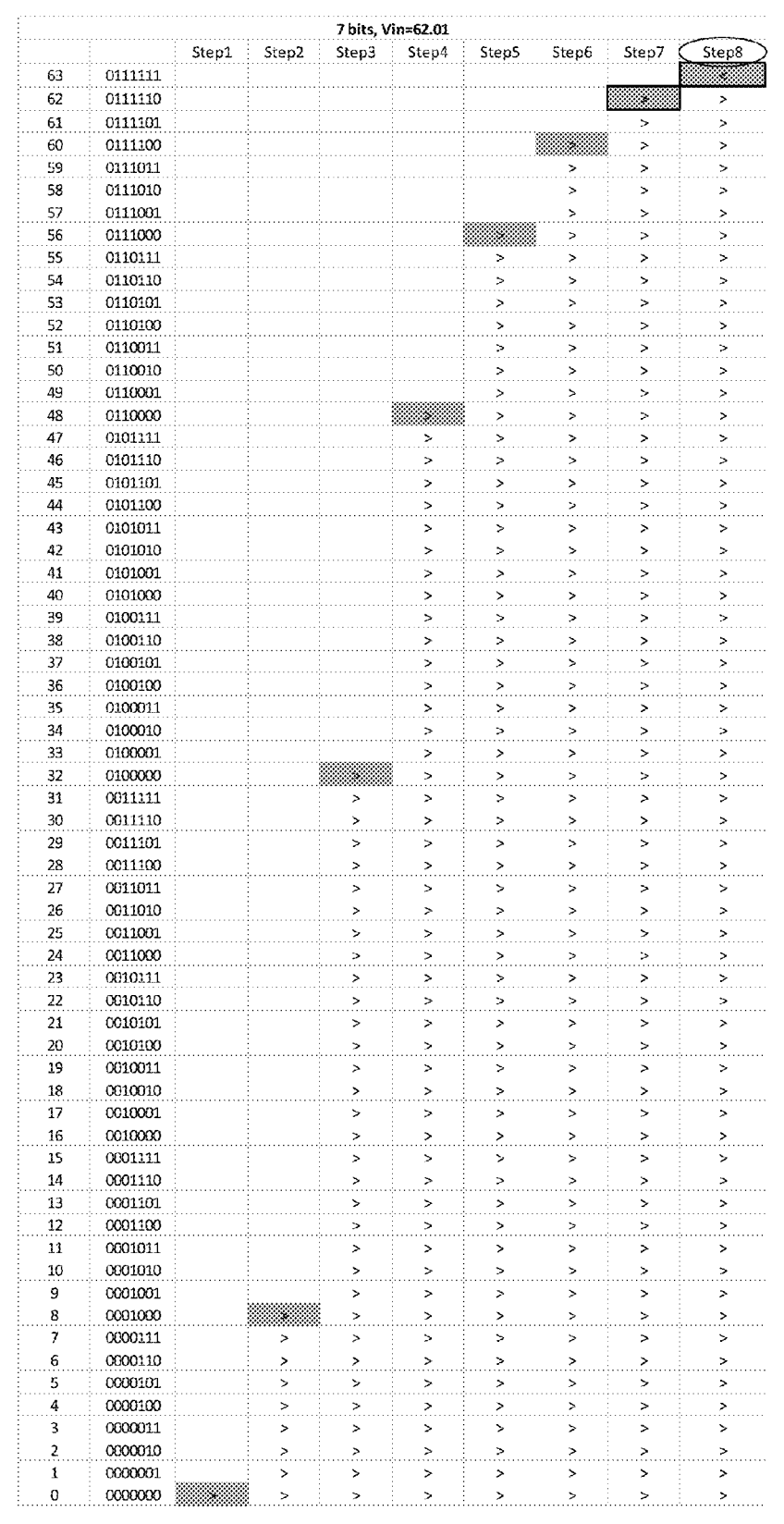

In FIGS. 6C and 6D, the analog input voltage samples V_IN to be digitized are greater than the second reference voltage V_REF of 8*VLSB. Moreover, because the analog input voltage V_IN is so far away from second reference voltage V_REF of 8*VLSB, the ADC 110 per method 300 uses eight steps to obtain the 7-bit digital word D_REF, D_OUT to 1-LSB accuracy—one more than the conversions depicted in FIGS. 4C and 4D.

In an example implementation, the amount of time available to complete a conversion may be less than the amount of time used to achieve 1-LSB accuracy. For example, in FIGS. 4A-4D, the amount of time may be fixed at the amount of time for six comparisons or steps. Consequently, the ADC 110 may convert analog input voltages V_IN in the range −16*VLSB to 16*VLSB to 1-LSB accuracy, analog input voltages V_IN in the ranges −32*VLSB to −16*VLSB and 16*VLSB to 32*VLSB to 2-LSB accuracy, and analog input voltages V_IN in the ranges −64*VLSB to −32*VLSB and 32*VLSB to 64*VLSB to 4-LSB accuracy in the allotted six comparisons or steps. Such additional quantization noise for larger magnitude input voltages V_IN may be tolerable in, for example, systems where the data being converted undergoes subsequent error correction (e.g., LDPC). Such additional quantization noise for larger magnitude input voltages V_IN may also be tolerable in, for example, communications systems where the signal-to-noise ratio (SNR) is high enough and/or where such occurrences happen infrequently enough (i.e. threshold T is high enough) such that the additional quantization noise doesn't significantly impact overall performance (e.g., bit error rate remains above a minimum threshold).

In an example implementation, the amount of time available to complete a conversion may be fixed (e.g., because downstream circuitry cannot tolerate jitter in the conversion time). Where the fixed amount of time is not the minimum conversion time, the ADC 110 may use conversion time freed-up as a result of a sample adhering to the probabilities to iterate on the LSB(s) and average the conversion results to reduce the impact of thermal noise. For example, in FIGS. 5A-5D if the conversion time were fixed at seven steps, then:
conversions of input voltages V_IN between −16*VLSB to 16*VLSB may have an amount of time equal to one conversion step for iterating;
conversions of input voltage V_IN in the range −32*VLSB to −16*VLSB or in the range 16*VLSB to 32*VLSB may have just enough time to complete a conversion to 1-LSB accuracy without any iteration; and
conversions of input voltages V_IN in the range −64*VLSB to −32*VLSB or in the range 32*VLSB to 64*VLSB may only have time to complete to 2-LSB accuracy.

In other words, higher accuracy may be achieved for higher-likelihood values and less accuracy may be achieved for lower-likelihood values.

Figure 7C:
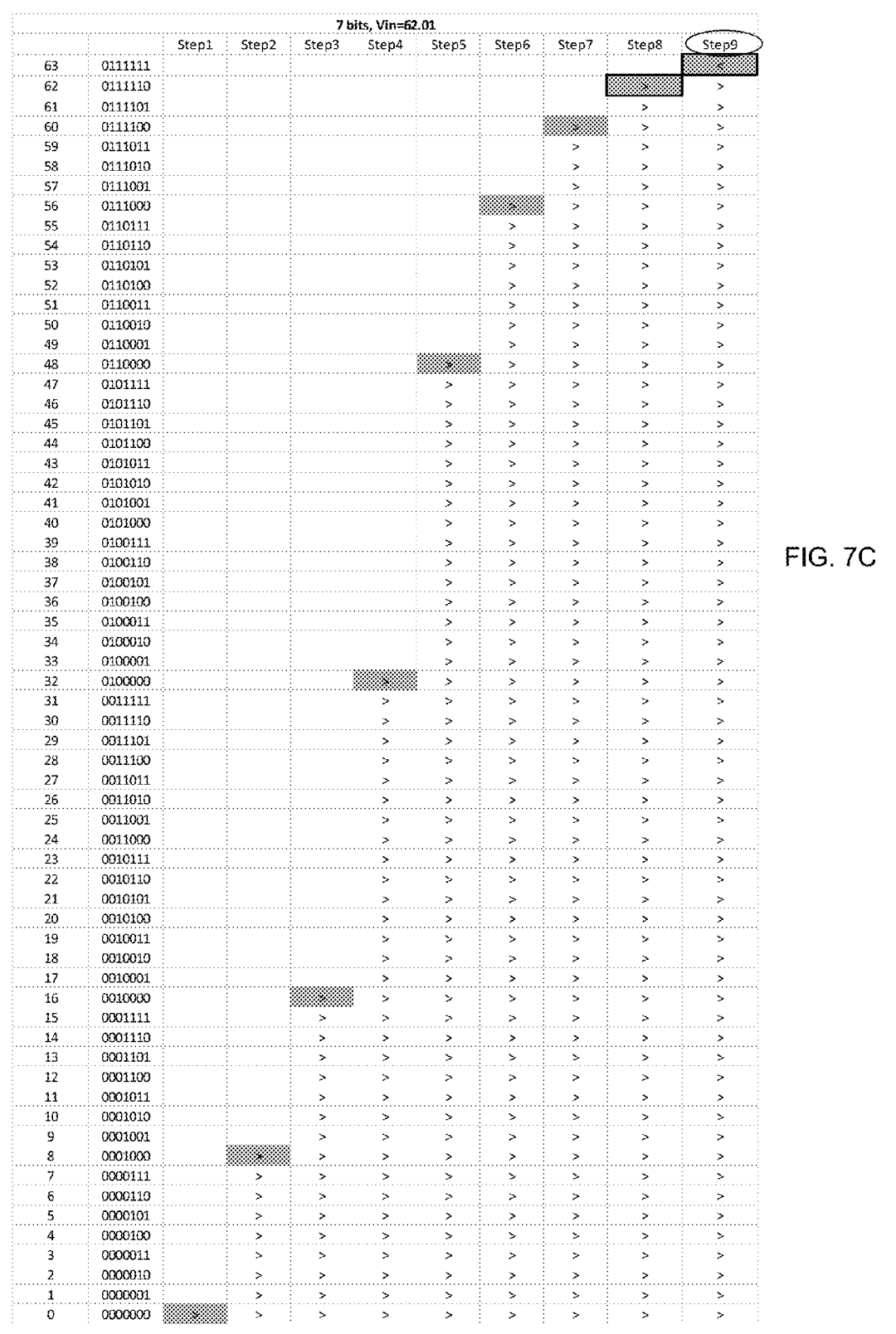

In FIGS. 6B-6D, where the sample to be digitized was greater than the second threshold, the search and decode logic module 130 at 350 jumps from the reference voltage V_REF of 8*VLSB back to an analog reference voltage V_REF of 32*VLSB (i.e., the voltage associated with an expected midpoint of an operating range of the analog input voltage V_IN). In FIGS. 7A-7C, on the other hand, the search and decode logic module 130 backs the reference voltage V_REF off more slowly toward the expected midpoint of an operating range of the analog input voltage V_IN. For example, instead of jumping directly back to the expected midpoint (e.g., 32*VLSB), the search and decode logic module 130 may update the reference voltage V_REF from 8*VLSB to a voltage (e.g., 16*VLSB) half way between the current reference voltage and the expected midpoint. Consequently, in FIG. 7A, the ADC 110 is able to complete the conversion to 1-LSB accuracy in six steps—as opposed to the seven steps depicted in FIG. 6B. In FIG. 7B, the slower back-off results in eight steps being required to achieve 1-LSB accuracy (the same number of steps as the conversion depicted in FIG. 6C). In FIG. 7C, however, the slower back-off results in an extra conversion (nine) step as compared to the conversion depicted in FIG. 6D. Thus, the faster back-off of FIGS. 6A-6D may be chosen where, for example, analog input voltages V_IN have a high-probability of being between −8*VLSB and 8*VLSB, a low-probability of being between −16*VLSB and −8*VLSB or between 8*VLSB and −16*VLSB, and a medium-probability of being between −64*VLSB and −16*VLSB or between 16*VLSB and 64*VLSB. Conversely, the slower back-off of FIGS. 7A-7C may be chosen where, for example, analog input voltages V_IN having a high-probability of being between −8*VLSB and 8*VLSB, a medium-probability of being between −16*VLSB and −8*VLSB or between 8*VLSB to −16*VLSB, and a low-probability of being between −64*VLSB and −16*VLSB or between 16*VLSB and 64*VLSB.

Although the searches in each of FIGS. 4A-7C begin with a comparison to zero, in other implementations the initial D_REF may be a value other than zero. For example, in FIGS. 5A-5D, if the probability of V_IN being a positive signal is above a threshold, then 16*VLSB may be the initial V_REF rather than the second value of V_REF. In such an implementation, FIG. 5B completes to 1-LSB accuracy in five steps, FIG. 5C completes to 1-LSB accuracy in six steps, and FIG. 5D completes to 1-LSB accuracy in seven steps. If V_IN were in fact negative, however, completion to 1-LSB accuracy may require more steps than a conventional binary search.

In an example implementation, during a conversion, the search and decode logic module 130 at 350 may select a next reference voltage V_REF based on an indication of how far above or below the analog input voltage V_IN is from the current reference voltage V_REF. For example, the comparator 120 may take a long time to settle or have a slow voltage slope with little or no overshoot. Such behavior of the comparator 120 may indicate that the current reference voltage V_REF is close to the input voltage V_IN and the next reference voltage V_REF may therefore be selected to be close to the current reference voltage V_REF. On the other hand, if the comparator 120 settles very quickly or has a steep voltage slope with a lot of overshoot, then the search and decode logic module 130 may select at 350 the next reference voltage V_REF to be far from the current reference voltage V_REF. For example, the search and decode logic module 130 may select the fast back-off (FIG. 6D) for a 7-bit conversion of an analog input voltage V_IN of 62.01 in response to the comparator 120 rapidly settling when comparing analog input voltage V_IN of 62.01 and to the second reference voltage V_REF of 8*VLSB. On the other hand, the search and decode logic module 130 may select the slow back-off (FIG. 7A) for a 7-bit conversion of an analog input voltage V_IN of 15.01 in response to the comparator 120 slowly settling when comparing the input voltage V_IN of 15.01 and the reference voltage V_REF of 8*VLSB.

In an example implementation, downstream circuitry may be operable to tolerate jitter in conversion time. For example, the downstream circuitry may comprise a variable rate interpolator which may interpolate the jitter conversions to fixed rate samples. The interpolator may use, for example, one or more flag signals (e.g., "early/late flag" of FIG. 2) that indicate whether the conversion completed "1 step early," "1 step late," "2 steps early" and so on.

In an example implementation, the search sequence may be adapted based on the PAPR of the analog input signal V_IN to be digitized. For example, where the input signal V_IN has a PAPR above a first threshold, the search and decode logic module 130 may use a first search sequence (e.g., having a second reference voltage of 16*VLSB) and where input signal V_IN has a PAPR above a second threshold that is greater than the first threshold, the search and decode logic module 130 at 350 may use a second search sequence (e.g., having a second reference voltage of 8*VLSB).

In an example implementation, gain (positive or negative) applied to the analog input voltage signal V_IN to be digitized may be controlled in a manner coordinated with the selection/adaptation of the search sequence.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method of an analog-to-digital converter, comprising:
    selecting, by the analog-to-digital converter, a reference voltage;
    updating, by the analog-to-digital converter, the reference voltage based on an indication of how far an analog input voltage is from the reference voltage; and
    repeating, one or more times by the analog-to-digital converter, said updating to obtain a digital output code representative of the analog input voltage.

2. The method of claim 1, further comprising determining the indication of how far the analog input voltage is from the reference voltage based upon settling behavior of a comparator that is configured to compare the reference voltage to the analog input voltage.

3. The method of claim 1, further comprising:
    comparing, via a comparator of the analog-to-digital converter, the analog input voltage to the reference voltage;
    determining that the analog input voltage is close to the reference voltage in response to the comparator having a first settling time during said comparing; and
    determining that the analog input voltage is far from the reference voltage in response to the comparator having a second settling time during said comparing;
    wherein the second settling time is shorter than the first settling time.

4. The method of claim 1, further comprising:
    comparing, via a comparator of the analog-to-digital converter, the analog input voltage to the reference voltage;
    determining that the analog input voltage is close to the reference voltage in response to the comparator having a first voltage slope time during said comparing; and
    determining that the analog input voltage is far from the reference voltage in response to the comparator having a second voltage slope during said comparing;
    wherein the second voltage slope is greater than the first voltage slope.

5. The method of claim 1, further comprising:
    comparing, via a comparator of the analog-to-digital converter, the analog input voltage to the reference voltage;
    determining that the analog input voltage is close to the reference voltage in response to the comparator having a first overshoot during said comparing; and
    determining that the analog input voltage is far from the reference voltage in response to the comparator having a second overshoot during said comparing;
    wherein the second overshoot is greater than the first overshoot.

6. The method of claim 1, wherein said updating comprises selecting between a faster back-off process and a slower back-off process of the reference voltage based on the indication of how far the analog input voltage is from the reference voltage.

7. The method of claim 1, wherein said updating comprises:
    selecting a first back-off process that updates the reference voltage at a first rate in response to determining that the analog input voltage is a first distance from the reference voltage; and selecting a second back-off process that updates the reference voltage at a second rate in response to determining that the analog input voltage is a second distance from the reference voltage;

wherein the first distance is less than the second distance; and wherein the first rate is less than the second rate.

8. The method of claim 1, further comprising outputting a flag signal that indicates whether the digital output code was obtained early with respect to a baseline number of comparisons.

9. The method of claim 1, further comprising outputting a flag signal that indicates whether the digital output code was obtained late with respect to a baseline number of comparisons.

10. The method of claim 1, wherein said selecting is based on peak-to-average power ratio of the analog input voltage.

11. A successive approximation analog-to-digital converter, comprising:
a digital-to-analog converter operable to generate a reference voltage based on a digital reference code;
a comparator operable to compare an analog input voltage to the reference voltage generated by the digital-to-analog converter and generate a comparison output indicative of the comparison; and
a search and decode logic module comprising one or more circuits operable to:
select the digital reference code;
update the digital reference code based on the comparison output and an indication of how far the analog input voltage is from the reference voltage; and
repeat, one or more times, said update of the digital reference code to obtain a digital output code representative of the analog input voltage.

12. The successive approximation analog-to-digital converter of claim 11, wherein the one or more circuits of the search and decode logic module are further operable to determine the indication of how far the analog input voltage is from the reference voltage based upon settling behavior of the comparator.

13. The successive approximation analog-to-digital converter of claim 11, wherein the one or more circuits of the search and decode logic module are further operable to:
determine that the analog input voltage is close to the reference voltage in response to the comparator having a first settling time; and
determine that the analog input voltage is far from the reference voltage in response to the comparator having a second settling time;
wherein the second settling time is shorter than the first settling time.

14. The successive approximation analog-to-digital converter of claim 11, wherein the one or more circuits of the search and decode logic module are further operable to:
determine that the analog input voltage is close to the reference voltage in response to the comparator having a first voltage slope time; and
determine that the analog input voltage is far from the reference voltage in response to the comparator having a second voltage slope;
wherein the second voltage slope is greater than the first voltage slope.

15. The successive approximation analog-to-digital converter of claim 11, wherein the one or more circuits of the search and decode logic module are further operable to:
determine that the analog input voltage is close to the reference voltage in response to the comparator having a first overshoot; and
determine that the analog input voltage is far from the reference voltage in response to the comparator having a second overshoot;
wherein the second overshoot is greater than the first overshoot.

16. The successive approximation analog-to-digital converter of claim 11, wherein the one or more circuits of the search and decode logic module are further operable to select between a faster back-off process and a slower back-off process of the reference voltage based on the indication of how far the analog input voltage is from the reference voltage.

17. The successive approximation analog-to-digital converter of claim 11, wherein the one or more circuits of the search and decode logic module are further operable to:
select a first back-off process that updates the reference voltage at a first rate in response to determining that the analog input voltage is a first distance from the reference voltage; and
select a second back-off process that updates the reference voltage at a second rate in response to determining that the analog input voltage is a second distance from the reference voltage;
wherein the first distance is less than the second distance; and
wherein the first rate is less than the second rate.

18. The successive approximation analog-to-digital converter of claim 11, wherein the one or more circuits of the search and decode logic module are further operable to output a flag signal that indicates whether the digital output code was obtained early with respect to a baseline number of comparisons.

19. The successive approximation analog-to-digital converter of claim 11, wherein the one or more circuits of the search and decode logic module are further operable to output a flag signal that indicates whether the digital output code was obtained late with respect to a baseline number of comparisons.

20. The successive approximation analog-to-digital converter of claim 11, wherein the one or more circuits of the search and decode logic module are further operable to select the digital reference code based on peak-to-average power ratio of the analog input voltage.

* * * * *